US006246345B1

(12) United States Patent
Davidson et al.

(10) Patent No.: US 6,246,345 B1
(45) Date of Patent: Jun. 12, 2001

(54) USING GAIN-ADAPTIVE QUANTIZATION AND NON-UNIFORM SYMBOL LENGTHS FOR IMPROVED AUDIO CODING

(75) Inventors: Grant Allen Davidson, Burlingame; Charles Quito Robinson; Michael Mead Truman, both of San Francisco, all of CA (US)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 0 days.

(21) Appl. No.: 09/349,645

(22) Filed: Jul. 8, 1999

Related U.S. Application Data

(60) Provisional application No. 60/172,245, filed on Apr. 16, 1999.

(51) Int. Cl.[7] ........................................ H03M 7/34

(52) U.S. Cl. ........................ 341/51; 704/501; 704/229; 348/384.1

(58) Field of Search ........................ 341/51, 131, 200; 704/200.1, 501, 500, 229, 226; 348/384.1

(56) References Cited

U.S. PATENT DOCUMENTS

| | | | | |
|---|---|---|---|---|
| 4,386,237 | | 5/1983 | Virupaksha et al. . | |
| 5,054,075 | * | 10/1991 | Hong et al. | 704/226 |
| 5,309,232 | * | 5/1994 | Hartung et al. | 348/384.1 |
| 5,365,553 | * | 11/1994 | Veldhuis et al. | 341/200 |
| 5,402,124 | * | 3/1995 | Todd et al. | 341/131 |
| 5,583,962 | * | 12/1996 | Davis et al. | 704/229 |
| 5,592,584 | * | 1/1997 | Ferreira et al. | 704/200.1 |
| 5,623,577 | * | 4/1997 | Fielder | 704/200.1 |
| 5,734,792 | | 3/1998 | Teh . | |
| 5,778,339 | | 7/1998 | Sonohara et al. . | |
| 5,844,512 | | 12/1998 | Gorin et al. . | |
| 5,890,125 | * | 3/1999 | Davis et al. | 704/501 |

* cited by examiner

*Primary Examiner*—Howard L. Williams
*Assistant Examiner*—Jean Barnes Jeanglaude
(74) *Attorney, Agent, or Firm*—David N. Lathrop; Gallagher & Lathrop

(57) ABSTRACT

Techniques like Huffman coding can be used to represent digital audio signal components more efficiently using non-uniform length symbols than can be represented by other coding techniques using uniform length symbols Unfortunately, the coding efficiency that can be achieved by Huffman coding depends on the probability density function of the information to be coded and the Huffman coding process itself requires considerable processing and memory resources. A coding process that uses gain-adaptive quantization according to the present invention can realize the advantage of using non-uniform length symbols while overcoming the shortcomings of Huffman coding. In gain-adaptive quantization, the magnitudes of signal components to be encoded are compared to one or more thresholds and placed into classes according to the results of the comparison. The magnitudes of the components placed into one of the classes are modified according to a gain factor that is related to the threshold used to classify the components. Preferably, the gain factor may be expressed as a function of only the threshold value. Gain-adaptive quantization may be used to encode frequency subband signals in split-band audio coding systems. Additional features including cascaded gain-adaptive quantization, intra-frame coding, split-interval and non-overloading quantizers are disclosed.

46 Claims, 7 Drawing Sheets

USING GAIN-ADAPTIVE QUANTIZATION AND NON-UNIFORM SYMBOL LENGTHS FOR IMPROVED AUDIO CODING

CROSS-REFERENCE TO RELATED APPLICATION

This application claims priority of copending provisional patent application Ser. No. 60/172,245, which was filed on Apr. 16, 1999 as a non-provisional application and subsequently converted to a provisional application by petition.

TECHNICAL FIELD

The present invention relates generally to encoding and decoding signals. The present invention may be used advantageously for split-band encoding and decoding in which frequency-subband signals are separately coded. The present invention is particularly useful in perceptual audio coding systems.

BACKGROUND ART

There is a continuing interest to encode digital audio signals in a form that imposes low information capacity requirements on transmission channels and storage media yet can convey the encoded audio signals with a high level of subjective quality. Perceptual coding systems attempt to achieve these conflicting goals by using a process that encodes and quantizes the audio signals in a manner that uses larger spectral components within the audio signal to mask or render inaudible the resultant quantizing noise. Generally, it is advantageous to control the shape and amplitude of the quantizing noise spectrum so that it lies just below the psychoacoustic masking threshold of the signal to be encoded.

A perceptual encoding process may be performed by a so called split-band encoder that applies a bank of analysis filters to the audio signal to obtain subband signals having bandwidths that are commensurate with the critical bands of the human auditory system, estimates the masking threshold of the audio signal by applying a perceptual model to the subband signals or to some other measure of audio signal spectral content, establishes quantization step sizes for quantizing the subband signals that are just small enough so that the resultant quantizing noise lies just below the estimated masking threshold of the audio signal, quantizes the subband signals according to the established quantization step sizes, and assembles into an encoded signal a plurality of symbols that represent the quantized subband signals. A complementary perceptual decoding process may be performed by a split-band decoder that extracts the symbols from the encoded signal and recovers the quantized subband signals therefrom, obtains dequantized representations of the quantized subband signals, and applies a bank of synthesis filters to the dequantized representations to generate an audio signal that is, ideally, perceptually indistinguishable from the original audio signal.

The coding processes in these coding systems often use a uniform length symbol to represent the quantized signal elements or components in each subband signal. Unfortunately, the use of uniform length symbols imposes a higher information capacity than is necessary. The required information capacity can be reduced by using non-uniform length symbols to represent the quantized components in each subband signal.

One technique for providing non-uniform length symbols is Huffman encoding of quantized subband-signal components. Typically, Huffman code tables are designed using "training signals" that have been selected to represent the signals to be encoded in actual applications. Huffman coding can provide very good coding gain if the average probability density function (PDF) of the training signals are reasonably close to the PDF of the actual signal to be encoded, and if the PDF is not flat.

If the PDF of the actual signal to be encoded is not close to the average PDF of the training signals, Huffman coding will not realize a coding gain but may incur a coding penalty, increasing the information capacity requirements of the encoded signal. This problem can be minimized by using multiple code books corresponding to different signal PDFs; however, additional storage space is required to store the code books and additional processing is required to encode the signal according to each code book and then pick the one that provides the best results.

There remains a need for a coding technique that can represent blocks of quantized subband-signal components using non-uniform length symbols within each subband, that is not dependent upon any particular PDF of component values, and can be performed efficiently using minimal computational and memory resources.

DISCLOSURE OF INVENTION

It is an object of the present invention to provide for the advantages that can be realized by using non-uniform length symbols to represent quantized signal components such as subband-signal components within a respective frequency subband in a split-band coding system.

The present invention achieves this object using a technique that does not depend upon any particular PDF of component values to achieve good coding gain and can be performed efficiently using minimal computational and memory resources. In some applications, coding systems may advantageously use features of the present invention in conjunction with other techniques like Huffman coding.

According to the teachings of one aspect of the present invention, a method for encoding an input signal comprises receiving the input signal and generating a subband-signal block of subband-signal components representing a frequency subband of the input signal; comparing magnitudes of the components in the subband-signal block with a threshold, placing each component into one of two or more classes according to component magnitude, and obtaining a gain factor; applying the gain factor to the components placed into one of the classes to modify the magnitudes of some of the components in the subband-signal block; quantizing the components in the subband-signal block; and assembling into an encoded signal control information conveying classification of the components and non-uniform length symbols representing the quantized subband-signal components.

According to the teachings of another aspect of the present invention, a method for decoding an encoded signal comprises receiving the encoded signal and obtaining therefrom control information and non-uniform length symbols, and obtaining from the non-uniform length symbols quantized subband-signal components representing a frequency subband of an input signal; dequantizing the subband-signal components to obtain subband-signal dequantized components; applying a gain factor to modify magnitudes of some of the dequantized components according to the control information; and generating an output signal in response to the subband-signal dequantized components.

These methods may be embodied in a medium as a program of instructions that can be executed by a device to carry out the present invention.

According to the teachings of another aspect of the present invention, an apparatus for encoding an input signal comprises an analysis filter having an input that receives the input signal and having an output through which is provided a subband-signal block of subband-signal components representing a frequency subband of the input signal; a subband-signal block analyzer coupled to the analysis filter that compares magnitudes of the components in the subband-signal block with a threshold, places each component into one of two or more classes according to component magnitude, and obtains a gain factor, a subband-signal component processor coupled to the subband-signal block analyzer that applies the gain factor to the components placed into one of the classes to modify the magnitudes of some of the components in the subband-signal block; a first quantizer coupled to the subband-signal processor that quantizes the components in the subband-signal block having magnitudes modified according to the gain factor; and a formatter coupled to the first quantizer that assembles non-uniform length symbols representing the quantized subband-signal components and control information conveying classification of the components into an encoded signal.

According to the teachings of yet another aspect of the present invention in an apparatus for decoding an encoded signal, the apparatus comprises a deformatter that receives the encoded signal and obtains therefrom control information and non-uniform length symbols, and obtains from the non-uniform length symbols quantized subband-signal components; a first dequantizer coupled to the deformatter that dequantizes some of the subband-signal components in the block according to the control information to obtain first dequantized components; a subband-signal block processor coupled to the first dequantizer that applies a gain factor to modify magnitudes of some of the first dequantized components in the subband-signal block according to the control information; and a synthesis filter having an input coupled to the subband-signal processor and having an output through which an output signal is provided.

According to the teachings of yet another aspect of the present invention, a medium conveys (1) non-uniform length symbols representing quantized subband-signal components, wherein the quantized subband-signal components correspond to elements of a subband-signal block representing a frequency subband of an audio signal; (2) control information indicating a classification of the quantized subband-signal components according to magnitudes of the corresponding subband-signal block elements; and (3) an indication of a gain factor that pertains to magnitudes of the quantized subband-signal components according to the control information.

The various features of the present invention and its preferred embodiments may be better understood by referring to the following discussion and the accompanying drawings in which like reference numerals refer to like elements in the several figures. The contents of the following discussion and the drawings are set forth as examples only and should not be understood to represent limitations upon the scope of the present invention.

MODES FOR CARRYING OUT THE INVENTION

A. Coding System

The present invention is directed toward improving the efficiency of representing quantized information such as audio information and finds advantageous application in coding systems that use split-band encoders and split-band decoders. Embodiments of a split-band encoder and a split-band decoder that incorporate various aspects of the present invention are illustrated in FIGS. 1 and 2, respectively.

1. Encoder a) Analysis Filtering

Figure 1:
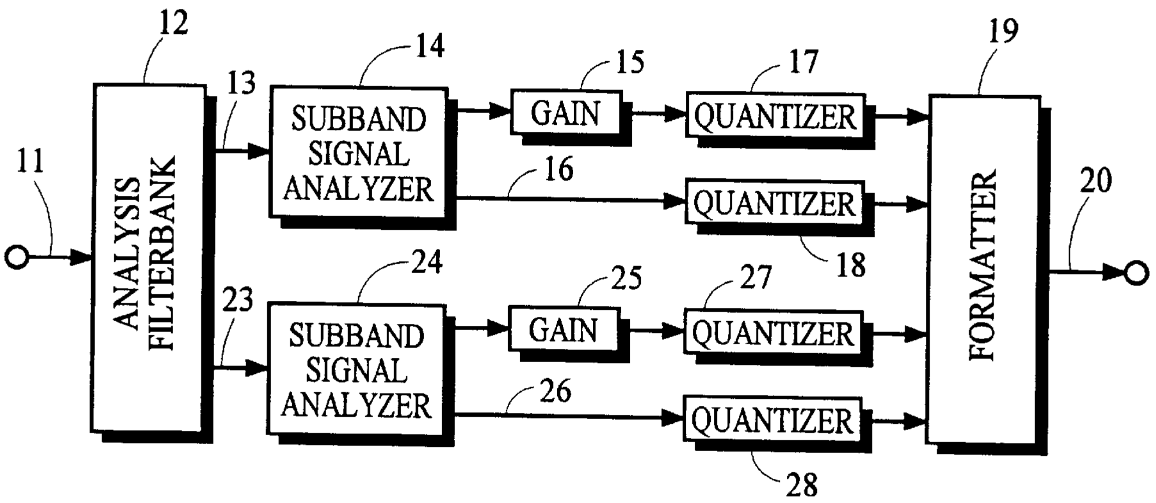
FIG. 1 is a block diagram of a split-band encoder incorporating gain-adaptive quantization.
Figure 2:
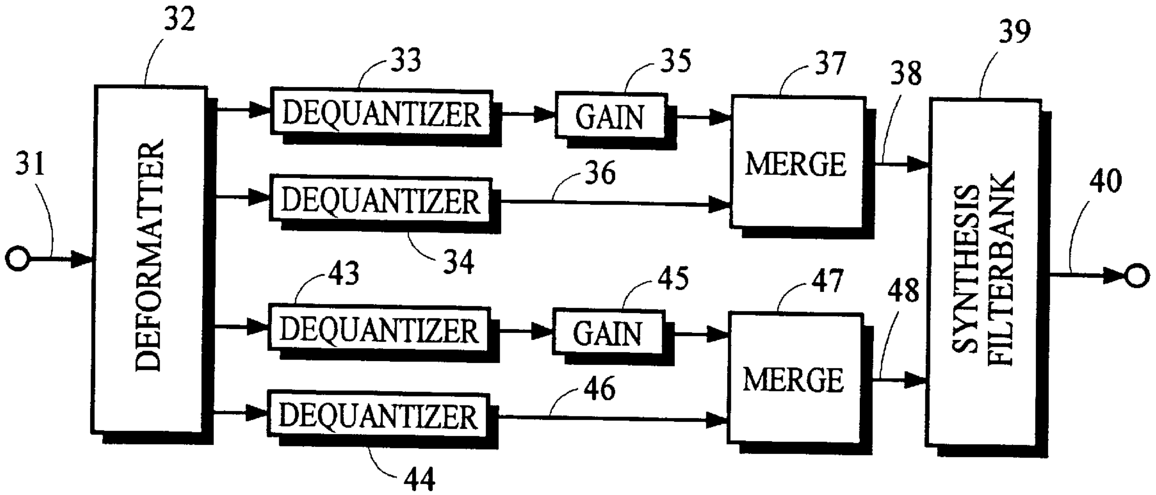
FIG. 2 is a block diagram of a split-band decoder incorporating gain-adaptive dequantization.

In FIG. 1, analysis filterbank 12 receives an input signal from path 11, splits the input signal into subband signals representing frequency subbands of the input signal, and passes the subband signals along paths 13 and 23. For the sake of illustrative clarity, the embodiments shown in FIGS. 1 and 2 illustrate components for only two subbands; however, it is common for a split-band encoder and decoder in a perceptual coding system to process many more subbands having bandwidths that are commensurate with the critical bandwidths of the human auditory system.

Analysis filterbank 12 may be implemented in a wide variety of ways including polyphase filters, lattice filters, the quadrature mirror filter (QMF), various time-domain-to-frequency-domain block transforms including Fourier-series type transforms, cosine-modulated filterbank transforms and wavelet transforms. In preferred embodiments, the bank of filters is implemented by weighting or modulating overlapped blocks of digital audio samples with an analysis window function and applying a particular Modified Discrete Cosine Transform (MDCT) to the window-weighted blocks. This MDCT is referred to as a Time-Domain Aliasing Cancellation (TDAC) transform and is disclosed in Princen, Johnson and Bradley, "Subband/Transform Coding Using Filter Bank Designs Based on Time Domain Aliasing Cancellation," *Proc. Int. Conf. Acoust., Speech, and Signal Proc.*, May 1987, pp. 2161–2164. Although the choice of implementation may have a profound effect on the performance of a coding system, no particular implementation of the analysis filterbank is important in concept to the present invention.

The subband signals passed along paths 13 and 23 each comprise subband-signal components that are arranged in blocks. In a preferred embodiment, each subband-signal block is represented in a block-scaled form in which the components are scaled with respect to a scale factor. A block-floating-point (BFP) form may be used, for example.

If analysis filterbank 12 is implemented by a block transform, for example, subband signals are generated by applying the transform to a block of input signal samples to generate a block of transform coefficients, and then grouping one or more adjacent transform coefficients to form the subband-signal blocks. If analysis filterbank 12 is implemented by another type of digital filter such as a QMF, for example, subband signals are generated by applying the filter to a sequence of input signal samples to generate a sequence of subband-signal samples for each frequency subband and then grouping the subband-signal samples into blocks. The subband-signal components for these two examples are transform coefficients and subband-signal samples, respectively.

b) Perceptual Modeling

Figure 3:
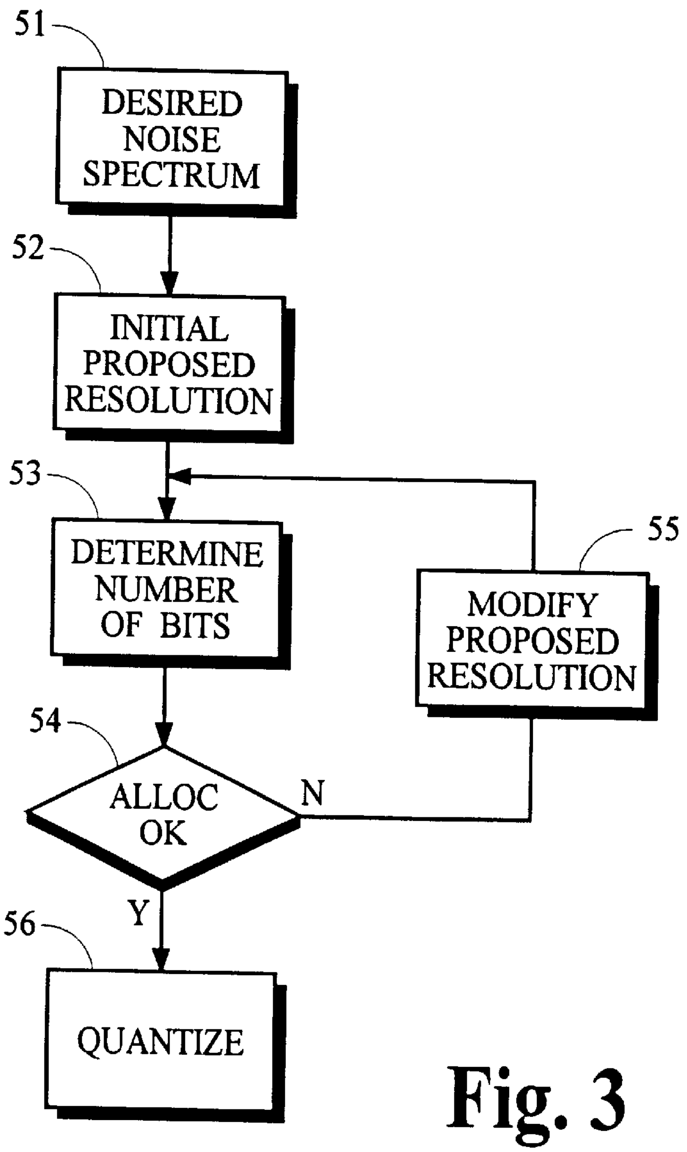
FIG. 3 is a flowchart illustrating steps in a reiterative bit-allocation process.

In a preferred embodiment for a perceptual coding system, the encoder uses a perceptual model to establish a respective quantization step size for quantizing each subband signal. One method that uses a perceptual model to adaptively allocate bits is illustrated in FIG. 3. According to this method, step 51 applies a perceptual model to information representing characteristics of the input signal to establish a desired quantization-noise spectrum. In many embodiments, the noise levels in this spectrum correspond to the estimated psychoacoustic masking threshold of the input signal. Step 52 establishes initial proposed quantization step sizes for quantizing the components in the subband-signal blocks. Step 53 determines the allocations of bits that are required to obtain the proposed quantization step sizes for all subband-signal components. Preferably, allowance is made for the noise-spreading effects of the synthesis filterbank in the split-band decoder to be used to decode the encoded signal. Several methods for making such an allowance are disclosed in U.S. Pat. No. 5,623,577 and in U.S. patent application Ser. No. 09/289,865 of Ubale, et al. entitled "Quantization in Perceptual Audio Coders with Compensation for Synthesis Filter Noise Spreading" filed Apr. 12, 1999, both of which are incorporated herein by reference.

Step 54 determines whether the total of the required allocations differs significantly from the total number of bits that are available for quantization. If the total allocation is too high, step 55 increases the proposed quantization step sizes. If the total allocation is too low, step 55 decreases the proposed quantization step sizes. The process returns to step 53 and reiterates this process until step 54 determines that the total allocation required to obtain the proposed quantization step sizes is sufficiently close to the total number of available bits. Subsequently, step 56 quantizes the subband-signal components according to the established quantization step sizes.

c) Gain-Adaptive Quantization

Gain-adaptive quantization may be incorporated into the method described above by including various aspects of the present invention into step 53, for example. Although the method described above is typical of many perceptual coding systems, it is only one example of a coding process that can incorporate the present invention. The present invention may be used in coding systems that use essentially any subjective and/or objective criteria to establish the step size for quantizing signal components. For ease of discussion, simplified embodiments are used herein to explain various aspects of the present invention.

The subband-signal block for one frequency subband is passed along path 13 to subband-signal analyzer 14, which compares the magnitude of the subband-signal components in each block with a threshold and places each component into one of two classes according to component magnitude. Control information conveying the classification of the components is passed to formatter 19. In a preferred embodiment, the components that have a magnitude less than or equal to the threshold are placed into a first class. Subband-signal analyzer 14 also obtains a gain factor for subsequent use. As will be explained below, preferably the value of the gain factor is related to the level of the threshold in some manner. For example, the threshold may be expressed as a function of only the gain factor. Alternatively, the threshold may be expressed as a function of the gain factor and other considerations.

Subband-signal components that are placed into the first class are passed to gain element 15, which applies the gain factor obtained by subband-signal analyzer 14 to each component in the first class, and the gain-modified components are then passed to quantizer 17. Quantizer 17 quantizes the gain-modified components according to a first quantization step size and passes the resulting quantized components to formatter 19. In a preferred embodiment, the first quantization step size is set according to a perceptual model and according to the value of the threshold used by subband-signal analyzer 14.

Subband-signal components that are not placed into the first class are passed along path 16 to quantizer 18, which quantizes these components according to a second quantization step size. The second quantization step size may be equal to the first quantization step size; however, in a preferred embodiment, the second quantization step size is smaller than the first quantization step size.

The subband-signal block for the second frequency subband is passed along path 23 and is processed by subband-signal analyzer 24, gain element 25, and quantizers 27 and 28 in the same manner as that described above for the first frequency subband. In a preferred embodiment, the threshold used for each frequency subband is adaptive and independent of the threshold used for other frequency subbands.

d) Encoded Signal Formatting

Formatter 19 assembles the control information conveying the classification of the components and non-uniform length symbols representing the quantized subband-signal components into an encoded signal and passes the encoded signal along path 20 to be conveyed by transmission media including baseband or modulated communication paths throughout the spectrum including from supersonic to ultraviolet frequencies, or by storage media including magnetic tape, magnetic disk and optical disc that convey information using a magnetic or optical recording technology.

The symbols used to represent the quantized components may be identical to the quantized values or they may be some type of code derived from the quantized values. For example, the symbols may be obtained directly from a quantizer or they may be obtained by some process such as Huffman encoding the quantized values. The quantized values themselves may be easily used as the non-uniform length symbols because non-uniform numbers of bits can be allocated to the quantized subband signal components in a subband.

2. Decoder a) Encoded Signal Deformatting

In FIG. 2, deformatter 32 receives an encoded signal from path 31 and obtains therefrom symbols that represent quantized subband-signal components and control information that conveys the classification of the components. Decoding processes can be applied as necessary to derive the quantized components from the symbols. In a preferred embodiment, gain-modified components are placed into a first class. Deformatter 32 also obtains any information that may be needed by any perceptual models or bit allocation processes, for example.

b) Gain-Adaptive Dequantization

Dequantizer 33 receives the components for one subband-signal block that are placed in the first class, dequantizes them according to a first quantization step size, and passes the result to gain element 35. In a preferred embodiment, the first quantization step size is set according to a perceptual model and according to a threshold that was used to classify the subband-signal components.

Gain element 35 applies a gain factor to the dequantized components received from dequantizer 33, and passes the gain-modified components to merge 37. The operation of gain element 35 reverses the gain modifications provided by gain element 15 in the companion encoder. As explained above, preferably this gain factor is related to the threshold that was used to classify the subband-signal components.

Subband-signal components that are not placed into the first class are passed to dequantizer 34, which dequantizes these components according to a second quantization step size, and passes the result to merge 37. The second quantization step size may be equal to the first quantization step size; however, in a preferred embodiment, the second quantization step size is smaller than the first quantization step size.

Merge 37 forms a subband-signal block by merging the gain-modified dequantized components received from gain element 35 with the dequantized components received from dequantizer 36, and passes the resulting subband-signal block along path 38 to synthesis filterbank 39.

Quantized components in the subband-signal block for the second frequency subband are processed by dequantizers 43 and 44, gain element 45 and merge 47 in the same manner as that described above for the first frequency subband, and passes the resulting subband-signal block along path 48 to synthesis filterbank 39.

c) Synthesis Filtering

Synthesis filterbank 39 may be implemented in a wide variety of ways that are complementary to the ways discussed above for implementing analysis filterbank 12. An output signal is generated along path 40 in response to the blocks of subband-signal components received from paths 38 and 48.

B. Features

1. Subband-Signal Component Classification a) Simplified Threshold Function

Figure 4:
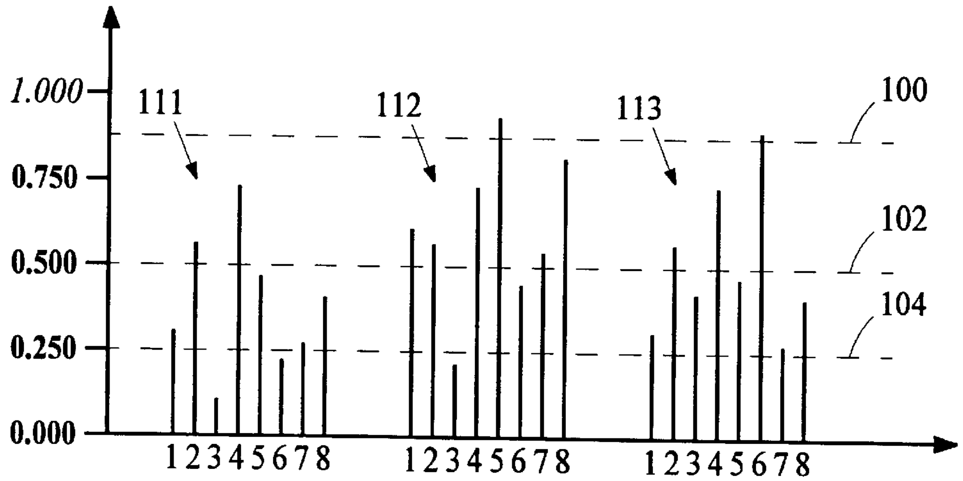
FIGS. 4 and 5 are graphical illustrations of hypothetical blocks of subband signal components and the effects of applying gain to the components.

The effects of gain-adaptive quantization may be appreciated by referring to FIG. 4, which illustrates hypothetical blocks 111, 112 and 113 of subband-signal components. In the example illustrated, each subband-signal block comprises eight components numbered from 1 to 8. Each component is represented by a vertical line and the magnitude of each component is represented by the height of the respective line. For example, component 1 in block 111 has a magnitude slightly larger than the value 0.25 as shown on the ordinate axis of the graph.

Line 102 represents a threshold at the 0.50 level. Each component in block 111 may be placed into one of two classes by comparing the respective component magnitudes with the threshold. The components having a magnitude less than or equal to the threshold are placed into a first class. The remaining components are placed into a second class. Alternatively, slightly different results may be obtained if components are classified by placing into the first class those components that have a magnitude strictly less than the threshold. For ease of discussion, threshold comparisons made according to the first example will be assumed and mentioned more particularly herein.

The components in block 112 are obtained by applying a gain factor of two to each block 111 component that is placed into the first class. For example, the magnitude of component 1 in block 112, which is slightly larger than 0.500, is obtained by multiplying the magnitude of component 1 in block 111 with a gain factor equal to two. Conversely, the magnitude of component 2 in block 112 is equal to the magnitude of component 2 in block 111 because this component was placed into the second class and is not modified by the gain factor.

Line 104 represents a threshold at the 0.25 level. Each component in block 111 may be placed into one of two classes by comparing the respective component magnitudes with this threshold and placing the components having a magnitude less than or equal to the threshold into a first class. The remaining components are placed into a second class.

The components in block 113 are obtained by applying a gain factor of four to each block 111 component that is placed into the first class. For example, the magnitude of component 3 in block 113, which is about 0.44, is obtained by multiplying the magnitude of component 3 in block 111, which is about 0.11, with a gain factor equal to four. Conversely, the magnitude of component 1 in block 113 is equal to the magnitude of component 1 in block 111 because this component was placed into the second class and is not modified by the gain factor.

The threshold may be expressed as a function of only the gain factor. As shown by these two examples, the threshold may be expressed as $$Th = \frac{1}{G} \tag{1}$$

where Th=the threshold value; and

G=gain factor.

b) Alternative Threshold Function

Unfortunately, a threshold obtained from expression I may be too large because a subband-signal component having a magnitude that is slightly less than threshold Th, when modified by gain factor G, may overload the quantizer.

A value is said to overload a quantizer if the quantization error of that value exceeds one-half the quantization step size. For symmetric quantizers having a uniform quantization step size that quantize values into a range from approximately −1 to +1, the region of positive quantities that overload the quantizer may be expressed as $$Q_{OL} > Q_{MAX} + \frac{\Delta Q}{2} \tag{2a}$$

and the region of negative values that overload the quantizer may be expressed as $$Q_{OL} < -Q_{MAX} - \frac{\Delta Q}{2} \tag{2b}$$

where $Q_{OL}$=a value that overloads the quantized $Q_{MAX}$=maximum positive quantized value; and $\Delta Q$=quantization step size.

For a b-bit symmetric mid-tread signed quantizer having a uniform quantization step size that quantizes values into a range from approximately −1 to +1, the maximum positive quantized value $Q_{MAX}$ is equal to $1-2^{1-b}$, the quantization step size ΔQ is equal to $2^{1-b}$, and one-half the quantization step size is equal to $2^{-b}$. Expression 2a for positive overload values may be rewritten as $$Q_{OL}>1-2^{1-b}+2^{-b}=1-2^{-b} \quad (3a)$$

and expression 2b for negative overload values may be rewritten as $$Q_{OL}<-(1-2^{1-b})-2^{-b}=-1+2^{-b}. \quad (3a)$$

Line 100 in FIG. 4 represents the boundary of positive overload values for a 3-bit symmetric mid-tread signed quantizer. The negative range of this quantizer is not shown. The maximum positive quantized value for this quantizer is $0.75=(1-2^{1-3})$ and one-half the quantization step size is $0.125=2^{-3}$; therefore, the boundary for the positive overload values for this quantizer is $0.875=(1-2^{-3})$. The boundary for negative overload values is −0.875.

Component 5 in block 111 has a magnitude that is slightly less than the threshold at value 0.500. When a gain factor equal to two is applied to this component, the resultant magnitude exceeds the overload boundary of the quantizer. A similar problem occurs for component 6 when a threshold equal to 0.250 is used with a gain factor equal to four.

A threshold value for positive quantities that avoids overload and optimally maps the domain of positive component values in the first class into the positive range of a quantizer may be expressed as $$Th=\frac{Q_{OL}}{G}. \quad (4a)$$

The threshold for the negative quantities may be expressed as $$Th=-\frac{Q_{OL}}{G}. \quad (4b)$$

Throughout the remainder of this discussion, only the positive threshold will be discussed. This simplification does not lose any generality because those operations that compare component magnitudes with a positive threshold are equivalent to other operations that compare component amplitudes with positive and negative thresholds.

For the b-bit symmetric mid-tread signed quantizer described above, the threshold function of expression 4a may be rewritten as $$Th=\frac{1-2^{-b}}{G}. \quad (5)$$

Figure 5:
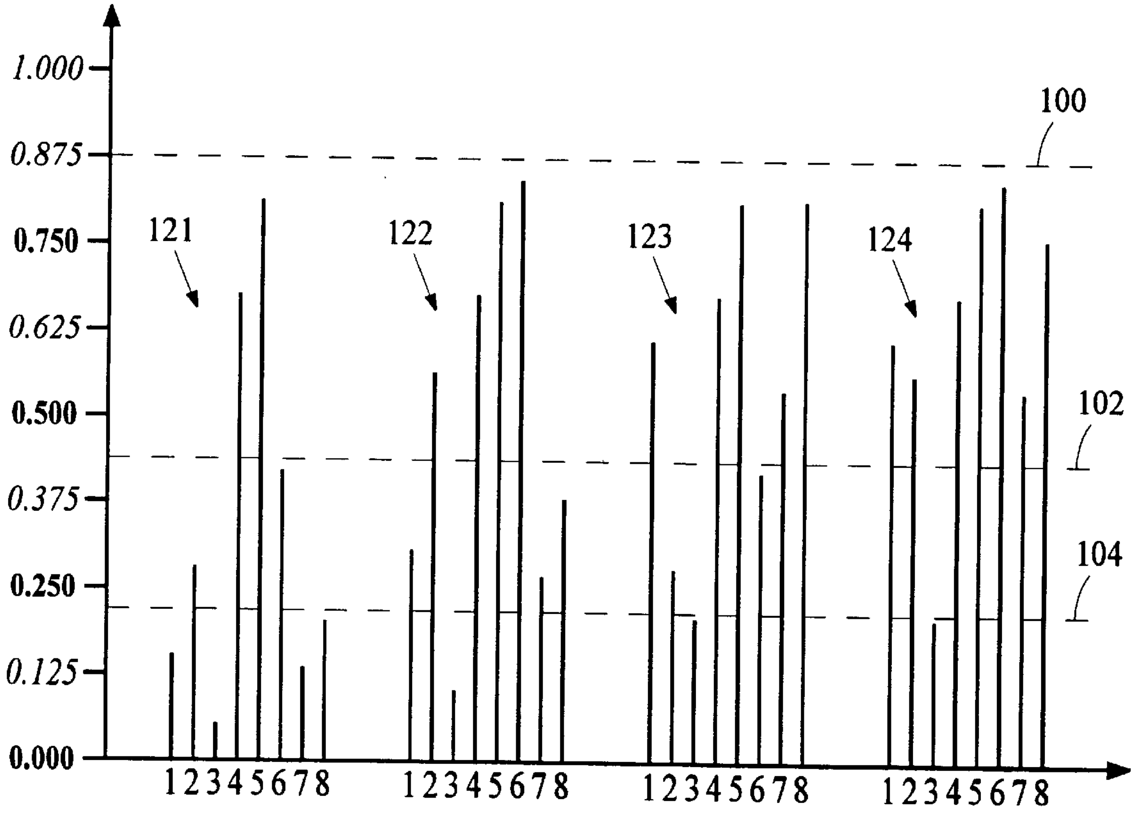

The effects of gain-adaptive quantization using this alternative threshold are illustrated in FIG. 5, which illustrates hypothetical blocks 121, 122, 123 and 124 of subband signal components. In the examples illustrated, each subband-signal block comprises eight components numbered from 1 to 8, the magnitudes of which are represented by the length of respective vertical lines. Lines 102 and 104 represent the thresholds for a 3-bit symmetric mid-tread signed quantizer for gain factors equal to 2 and 4, respectively. Line 100 represents the boundary of positive overload values for this quantizer.

The components in subband-signal block 122 may be obtained by comparing the magnitudes of the components in block 121 with threshold 102 and applying a gain of G=2 to the components that have magnitudes less than or equal to the threshold. Similarly, the components in subband-signal block 123 may be obtained by comparing the magnitudes of the components in block 121 with threshold 104 and applying a gain of G=4 to the components that have magnitudes less than or equal to this threshold. The components in subband-signal block 124 may be obtained using a cascade technique, described below. Unlike the examples shown in FIG. 4 for the first threshold discussed above, none of the gain-modified components shown in FIG. 5 exceed the overload boundary of the quantizer.

On one hand, the alternative threshold according to expression 5 is desirable because it avoids quantizer overload for small-magnitude components in the first class and optimally loads the quantizer. On the other hand, this threshold may not be desirable in some embodiments that seek an optimum quantization step size because the threshold cannot be determined until the quantization step size is established. In embodiments that adapt the quantization step size by allocating bits, the quantization step size cannot be established until the bit allocation b for a respective subband-signal block is known. This disadvantage is explained in more detail below.

2. Quantization

Preferably, the quantization step size of the quantizers used to quantize components in a subband-signal block is adapted in response to the gain factor for that block. In one embodiment using a process similar to that discussed above and illustrated in FIG. 3, a number of bits b is allocated to each component within a subband-signal block and then the quantization step size and possibly the bit allocation is adapted for each component according to the gain factor selected for that block. For this embodiment, the gain factor is selected from four possible values representing gains of 1, 2, 4 and 8. Components within that block are quantized using a symmetric mid-tread signed quantizer.

Larger-magnitude components that are not placed into the first class and are not gain modified are assigned the same b number of bits as would be allocated without the benefit of the present invention. In an alternative embodiment using a split-interval quantization function discussed below, the bit allocation for these larger-magnitude components can be reduced for some gain factors.

Smaller-magnitude components that are placed into the first class and are gain modified are allocated a number of bits according to the values shown in Table I.

TABLE I

| Gain | Allocation |
|---|---|
| 1 | b |
| 2 | b-1 |
| 4 | b-2 |
| 8 | b-3 |

A gain factor equal to 1 for a particular subband-signal block indicates the gain-modified feature of the present invention is not applied to that block; therefore, the same b number of bits are allocated to each component as would be allocated without the benefit of the present invention. The use of gain factor G=2, 4 and 8 for a particular subband-signal block can potentially provide the benefit of a reduced allocation of 1, 2 and 3 bits, respectively, for each smaller-magnitude component in that subband block.

The allocations shown in Table I are subject to the limitation that the number of bits allocated to each component cannot be less than one. For example, if the bit-allocation process allocated b=3 bits to the components of a particular subband-signal block and a gain factor G=8 is selected for that block, the bit allocation for the smaller-magnitude components would be reduced to one bit rather than to zero bits as suggested by Table I. The intended effect of the gain modification and the adjustment to the bit allocation is to preserve essentially the same signal-to-quantization-noise ratio using fewer bits. If desired, an embodiment may avoid selecting any gain factor that does not reduce the number of allocated bits.

3. Control Information

As explained above, subband-signal analyzer 14 provides control information to formatter 19 for assembly into the encoded signal. This control information conveys the classification for each component in a subband-signal block. This control information may be included in the encoded signal in a variety of ways.

One way to include control information is to embed into the encoded signal a string of bits for each subband-signal block in which one bit corresponds to each component in the block. A bit set to one value, the value 1 for example, would indicate the corresponding component is not a gain modified component, and a bit set to the other value, which is the value 0 in this example, would indicate the corresponding component is a gain modified component. Another way to include control information is to embed a special "escape code" in the encoded signal immediately preceding each component that is gain modified or, alternatively, is not gain modified.

In the preferred embodiment discussed above that uses a symmetric mid-tread signed quantizer, each large-magnitude component that is not gain modified is preceded by an escape code that is equal to an unused quantization value. For example, the quantization values for a 3-bit two's complement signed quantizer ranges from a minimum of −0.750, represented by the 3-bit binary string b'Φ, to a maximum of +0.75, represented by the binary string b'011. The binary string b'100, which corresponds to −1.000, is not used for quantization and is available for use as control information. Similarly, the unused binary string for a 4-bit two's complement signed quantizer is b'1000.

Referring to subband-signal block 121 in FIG. 5, components 4 and 5 are large-magnitude components that exceed threshold 102. If this threshold is used in conjunction with a gain factor G=2, the bit allocation for all small-magnitude components placed in the first class is b-1 as shown above in Table I. If the bit-allocation process allocates b=4 bits to each component in block 121, for example, the allocation for each subband-signal component would be reduced to 3=(b-1) bits and a 3-bit quantizer would be used to quantize the small-magnitude components. Each large-magnitude component, which in this example are components 4 and 5, would be quantized with a 4-bit quantizer and identified by control information that equals the unused binary string of the 3-bit quantizer, or b'100. This control information for each large-magnitude component can be conveniently assembled into the encoded signal immediately preceding the respective large-magnitude component.

It may be instructional to point out that the present invention does not provide any benefit in the example discussed in the preceding paragraph. The cost or overhead required to convey the control information, which is six bits in this example, is equal to the number of bits that are saved by reducing the bit allocation for the small-magnitude components. Referring to the example above, if only one component in block 121 were a large-magnitude component, the present invention would reduce the number of bits required to convey this block by four. Seven bits would be saved by reduced allocations to seven small-magnitude components and only three bits would be required to convey the control information for the one large-magnitude component.

This last example ignores one additional aspect. Two bits are required for each subband-signal block in this exemplary embodiment to convey which of four gain factors are used for that block. As mentioned above, a gain factor equal to I may be used to indicate the features of the present invention are not applied for a particular subband- signal block.

The present invention usually does not provide any advantage for quantizing subband-signal blocks with four or fewer components. In perceptual coding systems that generate subband signals having bandwidths commensurate with the critical bandwidths of the human auditory system, the number of components in subband-signal blocks for low-frequency subbands is low, perhaps only one component per block, but the number of components per subband-signal block increases with increasing subband frequency. As a result, in preferred embodiments, the processing required to implement features of the present invention may be restricted to the wider subbands. An additional piece of control information may be embedded into the encoded signal to indicate the lowest frequency subband in which gain-adaptive quantization is used. The encoder can adaptively select this subband according to input signal characteristics. This technique avoids the need to provide control information for subbands that do not use gain-adaptive quantization.

4. Decoder Features

A decoder that incorporates features of the present invention may adaptively change the quantization step size of its dequantizers in essentially any manner. For example, a decoder that is intended to decode an encoded signal generated by encoder embodiments discussed above may use adaptive bit allocation to set the quantization step size. The decoder may operate in a so called forward-adaptive system in which the bit allocations may be obtained directly from the encoded signal, it may operate in a so called backward-adaptive system in which the bit allocations are obtained by repeating the same allocation process that was used in the encoder, or it may operate in a hybrid of the two systems. The allocation values obtained in this manner are referred to as the "conventional" bit allocations.

The decoder obtains control information from the encoded signal to identify gain factors and the classification of the components in each subband-signal block. Continuing the example discussed above, control information that conveys a gain factor G=1 indicates the gain-adaptive feature was not used and the conventional bit allocation b should be used to dequantize the components in that particular subband-signal block. For other gain factor values, the conventional bit allocation b for a block is used to determine the value of the "escape code" or control information that identifies the large-magnitude components. In the example given above, an allocation of b=4 with a gain factor G=2 indicates the control information is the binary string b'100, which has a length equal to 3=(b-1) bits. The presence of this control information in the encoded signal indicates a large-magnitude component immediately follows.

The bit allocation for each gain-modified component is adjusted as discussed above and shown in Table I. Dequantization is carried out using the appropriate quantization step size and the gain-modified components are subjected to a gain factor that is the reciprocal of the gain factor used to carry out gain modification in the encoder. For example, if small-magnitude components were multiplied by a gain factor G=2 in the encoder, the decoder applies a reciprocal gain G=0.5 to the corresponding dequantized components.

C. Additional Features

In addition to the variations discussed above, several alternatives are discussed below.

1. Additional Classifications

According to one alternative, the magnitudes of the components in a subband-signal block are compared to two or more thresholds and placed into more than two classes. Referring to FIG. 5, for example, the magnitude of each component in block 121 could be compared to thresholds 102 and 104 and placed into one of three classes. Gain factors could be obtained for two of the classes and applied to the appropriate components. For example, a gain factor G=4 could be applied to the components having magnitudes less than or equal to threshold 104 and a gain factor G=2 could be applied to the components having a magnitude less than or equal to threshold 102 but larger than threshold 104. Alternatively, a gain factor G=2 could be applied to all of the components having magnitudes less than or equal to threshold 102 and a gain factor G=2 could be applied again to the components that had magnitudes less than or equal to threshold 104.

2. Cascaded Operation

Figure 6:
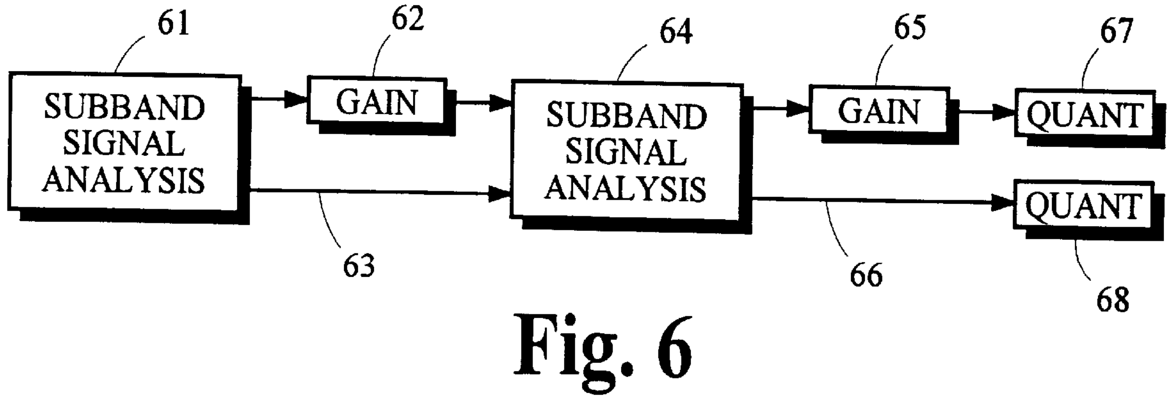
FIG. 6 is a block diagram of cascaded gain stages for gain-adaptive quantization.

The gain modification process described above may be carried out multiple times prior to quantization. FIG. 6 is a block diagram that illustrates one embodiment of two gain stages in cascade. In this embodiment, subband-signal analyzer 61 compares the magnitudes of the components in a subband-signal block with a first threshold and places the components into one of two classes. Gain element 62 applies a first gain factor to the components placed into one of the classes. The value of the first gain factor is related to the value of the first threshold.

Subband-signal analyzer 64 compares the magnitudes of the gain-modified components and possibly the remaining components in the block with a second threshold and places the components into one of two classes. Gain element 65 applies a second gain factor to the components placed into one of the classes. The value of the second gain factor is related to the value of the second threshold. If the second threshold is less than or equal to the first threshold, subband-signal analyzer 64 does not need to analyze the components that analyzer 61 placed into the class for magnitudes greater than the first threshold.

The subband-signal block components are quantized by quantizers 67 and 68 in a manner similar to that discussed above.

Referring to FIG. 5, the components in subband-signal block 124 may be obtained by the successive application of gain stages in which subband-signal analyzer 61 and gain element 62 apply a gain factor G=2 to the components having a magnitude less than or equal to threshold 102, and subband-signal analyzer 64 and gain element 65 apply a gain factor G=2 to the gain-modified components having a magnitude that is still less than or equal to threshold 102. For example, components 1 to 3 and 6 to 8 in block 121 are modified by a gain factor G=2 in the first stage, which produces an interim result that is shown in block 122. Components 1, 3, 7 and 8 are modified by a gain factor G=2 in the second stage to obtain the result shown for block 124.

In embodiments that use gain stages in cascade, suitable control information should be provided in the encoded signal so that the decoder can carry out a complementary set of gain stages in cascade.

3. Optimized Bit Allocation

There are several possible strategies for applying gain-adaptive quantization. One simple strategy analyzes the components in a respective subband-signal block by starting with a first threshold and related first gain factor G=2 and determines if gain-adaptive quantization according to the first threshold and first gain factor yields a reduction in the bit allocation requirements. If it does not, analysis stops and gain-adaptive quantization is not carried out. If it does yield a reduction, analysis continues with a second threshold and related second gain factor G=4. If the use of the second threshold and related gain factor does not yield a reduction in bit allocation, gain adaptive quantization is carried out using the first threshold and first gain factor. If the use of the second threshold and second gain factor does yield a reduction, analysis continues with a third threshold and related third gain factor G=8. This process continues until either the use of a threshold and related gain factor do not yield a reduction in bit allocation, or until all combinations of thresholds and related gain factors have been considered.

Another strategy seeks to optimize the choice of gain factor by calculating the cost and benefit provided by each possible threshold and related gain factor and using the threshold and gain factor that yield the greatest net benefit. For the example discussed above, the net benefit for a particular threshold and related gain factor is the gross benefit less the cost. The gross benefit is the number of bits that are saved by reducing the bit allocation for the small-magnitude components that are gain modified. The cost is the number of bits that are required to convey the control information for the large-magnitude components that are not gain modified.

One way in which this preferred strategy may be implemented is shown in the following program fragment. This program fragment is expressed in pseudo-code using a syntax that includes some syntactical features of the C, FORTRAN and BASIC programming languages. This program fragment and the other programs shown herein are not intended to be source code segments that are suitable for compilation but are provided to convey a few aspects of possible implementations.

```
Gain (X, N, b) {
    Th2 = (1-2^(-b))/ gf[1];        //initialize threshold for gain factor G=2
    Th4 = Th2 / 2;                  //. . . for gain factor G=4
    Th8 = Th4 / 2;                  //. . . for gain factor G=8
    n2 = n4 = n8 = 0;               //initialize counters
    for (k=1 to N) {                //for each component k . . .
        CompMag = Abs(X[k]);          //get component magnitude
        if(CompMag > Th2)
          n2 = n2 + 1;                //count components above Th2
        else if(CompMag > Th4)
```

-continued

```
            n4 = n4 + 1;                    //count comp between Th4 and Th2
        else if(CompMag > Th8)
            n8 = n8 + 1;                    //count comp between Th8 and Th4
    }
    n24 = n2 + n4;                      //no. of large components above Th4
    n248 = n24 + n8;                    //no. of large components above Th8
    benefit2 = Min(b-1, 1);             //bits per small component saved by using G=2
    benefit4 = Min(b-1, 2);             //bits per small component saved by using G=4
    benefit8 = Min(b-1, 3);             //bits per small component saved by using G=8
    net[0] = 0;                         //net benefit for no gain modification
    net[1] = (N-n2) * benefit2 - n2 * (b-benefit2);        //net benefit for using G=2
    net[2] = (N-n24) * benefit4 - n24 * (b-benefit4);      //net benefit for using G=4
    net[3] = (N-n248) * benefit8 - 248 * (b-benefit8);     //net benefit for using G=8
    j = IndexMax(net[j], j=0 to 3);         //get index of maximum benefit
    Gain = gf[j];                           //get gain factor
}
```

The function Gain is provided with an array X of subband-signal block components, the number N of components in the block, and the conventional bit allocation b for the block of components. The first statement in the function uses a calculation according to expression 5, shown above, to initialize the variable Th2 to represent the threshold that is related to a gain factor G=2 that is obtained from an array gf. In this example, the gain factors gf[1], gf[2] and gf[3] are equal to G=2, 4 and 8, respectively. The next statements initialize variables for the thresholds that are related to gain factors G=4 and 8. Next, counters are initialized to zero that will be used to determine the number of large-magnitude components in various classes.

The statements in the for-loop invoke function Abs to obtain the magnitude for each subband-signal block component in the array X and then compare the component magnitude with the thresholds, starting with the highest threshold. If the magnitude is greater than threshold Th2, for example, the variable n2 is incremented by one. When the for-loop is finished, the variable n2 contains the number of components that have a magnitude greater than threshold Th2, the variable n4 contains the number of components that have a magnitude that is greater than threshold Th4 but less than or equal to threshold Th2, and the variable n8 contains the number of components that have a magnitude that is greater than threshold Th8 but less than or equal to threshold Th4.

The two statements immediately following the for-loop calculate the total number of components that are above respective thresholds. The number in variable n24 represents the number of components that have a magnitude greater than threshold Th4, and the number in variable n248 represents the number of components that have a magnitude greater than threshold Th8.

The next three statements calculate the benefit per small-magnitude component for using each gain factor. This benefit may be as much as 1, 2 or 3 bits per component as shown above in Table I, but the benefit is also limited to be no more than b-1 bits per component since the allocation to each component is limited to a minimum of one bit. For example, the number in variable benefit2 represents the number of bits per small-magnitude component that are saved by using a gain factor G=2. As shown in Table I, this benefit may be as much as one bit; however, the benefit is also limited to be no greater than the conventional bit allocation b minus one. The calculation of this benefit is provided by using the function Min to return the minimum of the two values b-1 and 1.

Net benefits are then calculated and assigned to elements of array net. The element net[0] represents the net benefit of not using gain-adaptive quantization, which is zero. The net benefit for using a gain factor G=2 is assigned to net[1] by multiplying the appropriate benefit per small-magnitude component benefit2 by the appropriate number of small-magnitude components (N-n2) and then subtracting the cost, which is the number of large-magnitude components n2 multiplied by the length of the unused quantizer value used for the control information. This length is the bit-length of the small-magnitude components, which may be obtained from the conventional bit allocation b reduced by the bits saved per small-magnitude component. For example, the bit-length of the small-magnitude components when the gain factor G=2 is the quantity (b-benefit2). Similar calculations are performed to assign the net benefit for using gain factors G-4 and 8 to variables net[2] and net [3], respectively.

The function IndexMax is invoked to obtain the array index j for the largest net benefit in the array net. This index is used to obtain the appropriate gain factor from the gf array, which is returned by the function Gain.

4. Improved Efficiency Using the Simplified Threshold Function

It was mentioned above that various features of the present invention may be incorporated into a perceptual bit allocation process such as that illustrated in FIG. 3. In particular, these features may be performed in step 53. Step 53 is performed within a loop that reiteratively determines a proposed bit allocation for quantizing components in each subband-signal block to be encoded. Because of this, the efficiency of the operations performed in step 53 are very important The process discussed above for function Gain, which determines the optimum gain factor for each block, is relatively inefficient because it must count the number of subband-signal block components that are placed in various classes. The component counts must be calculated during each iteration because the thresholds that are obtained according to expression 5 cannot be calculated until the proposed bit allocation b for each iteration is known.

In contrast to the thresholds obtained according to expression 5, the thresholds obtained according to expression 1 are less accurate but can be calculated before the proposed bit allocation b is known. This allows the thresholds and the component counts to be calculated outside the reiteration. Referring to the method shown in FIG. 3, the thresholds Th1, Th2 and Th3, and the component counts n2, n24 and n248 could be calculated in step 52, for example.

An alternative version of the function Gain discussed above, which may be used in this embodiment, is shown in the following program fragment.

```
Gain2 (X, N) {
    benefit2 = Min(b−1, 1);       //bits per small component saved by using G=2
    benefit4 = Min(b−1, 2);       //bits per small component saved by using G=4
    benefit8 = Min(b−1, 3);       //bits per small component saved by using G=8
    net[0] = 0;                   //net benefit for no gain modification
    net[1] = (N−n2) * benefit2 − n2 * (b-benefit2);       //net benefit for using G=2
    net[2] = (N−n24) * benefit4 − n24 * (b-benefit4);     //net benefit for using G=4
    net[3] = (N−n248) * benefit8 − n248 * (b-benefit8);   //net benefit for using G=8
    j = IndexMax(net[j], j=0 to 3);         //get index of maximum benefit
    Gain = gf[j];                           //get gain factor
}
```

The statements in function Gain2 are identical to the corresponding statements in function Gain discussed above that calculate the net benefits for each gain factor and then select the optimum gain factor.

5. Quantization Functions a) Split-Interval Functions

The quantization accuracy of large-magnitude components can be improved by using a split-interval quantization function that quantizes input values within two non-contiguous intervals.

Figure 7:
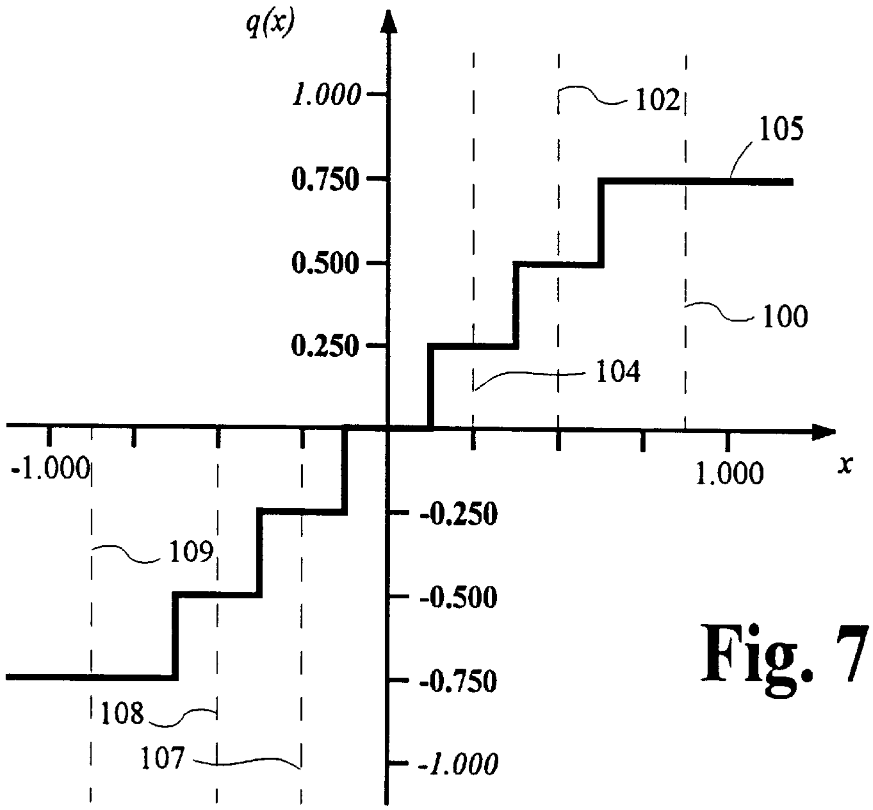
FIGS. 7 and 8 are graphical illustrations of quantization functions.

Line 105 in FIG. 7 is a graphical illustration of a function that represents the end-to-end effect of a 3-bit symmetric mid-tread signed quantizer and complementary dequantizer. Values along the x axis represent input values to the quantizer and values along the q(x) axis represent corresponding output values obtained from the dequantizer. Lines 100 and 109 represent the boundaries of positive and negative overload values, respectively, for this quantizer. Lines 102 and 108 represent the positive and negative thresholds, respectively, for gain factor G=2 according to expression I and as shown in FIG. 4. Lines 104 and 107 represent the positive and negative thresholds, respectively, for gain factor G=4.

Referring to FIG. 1, if subband-signal analyzer 14 classifies subband-signal block components according to threshold 102, then it is known that the magnitudes of the components provided to quantizer 18 are all greater than threshold 102. In other words, quantizer 18 would not be used to quantize any values that fall between thresholds 108 and 102. This void represents an under utilization of the quantizer.

Figure 8:
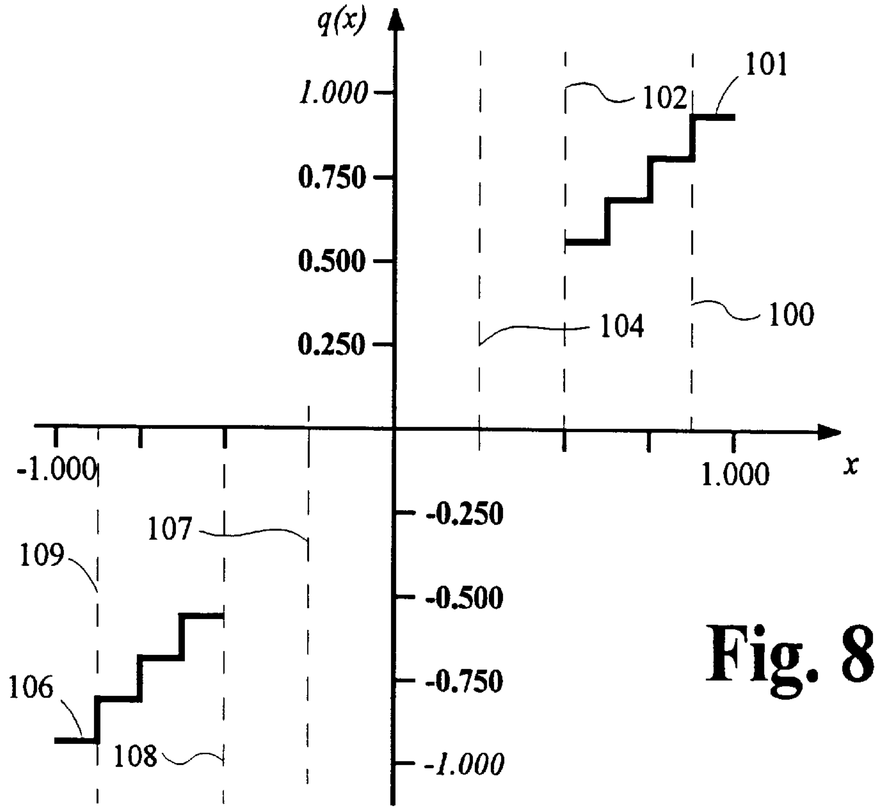

This under utilization may be overcome by using a quantizer that implements a split-interval quantization function. A variety of split-interval functions are possible. FIG. 8 is a graphical illustration of a function that represents the end-to-end effect of one split-interval 3-bit signed quantizer and a complementary dequantizer. Line 101 represents the function for positive quantities and line 106 represents the function for negative quantities.

The function shown in FIG. 8 has eight quantization levels in contrast to the function shown in FIG. 7, which has only seven quantization levels. The additional quantization level is obtained by using the level discussed above that, for a mid-tread quantization function, corresponds to −1.

b) Non-Overloading Quantizers

A 3-bit quantizer and complementary dequantizer that implement the function illustrated in FIG. 8 is preferred for quantizing values within a split-interval from −1.0 to about −0.5 and from about +0.5 to +1.0 because the quantizer cannot be overloaded. As explained above, a value overloads a quantizer if the quantization error of that value exceeds one-half the quantization step size. In the example shown in FIG. 8, dequantizer outputs are defined for values equal to −0.9375, −0.8125, −0.6875, −0.5625, +0.5625, +0.6875, +0.8125 and +0.9375, and the quantization step size is equal to 0.125. The magnitude of the quantization error for all values within the split-interval mentioned above is no greater than 0.0625, which is equal to one-half the quantization step size. Such a quantizer is referred to herein as a "non-overloading quantizer" because it is immune to overload.

Non-overloading single- and split-interval quantizers for essentially any quantization step size may be realized by implementing a quantization function having quantizer outputs that are bounded by quantizer "decision points" spaced appropriately within the intervals of values to be quantized. Generally speaking, the decision points are spaced apart from one another by some distance d and the decision points that are closest to a respective end of an input-value interval are spaced from the respective end by the amount d. This spacing provides a quantizer that, when used with a complementary dequantizer, provides uniformly spaced quantized output values separated from one another by a particular quantization step size and having a maximum quantization error that is equal to one-half this particular quantization step size.

c) Mapping Functions

Figure 9A:
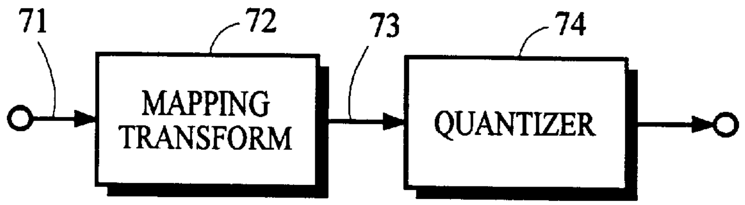
FIGS. 9A through 9C illustrate how a split-interval quantization function can be implemented using a mapping transform.

A split-interval quantizer may be implemented in a variety of ways. No particular implementation is critical. One implementation, shown in FIG. 9A, comprises mapping transform 72 in cascade with quantizer 74. Mapping transform 72 receives input values from path 71, maps these input values into an appropriate interval, and passes the mapped values along path 73 to quantizer 74.

Figure 9B:
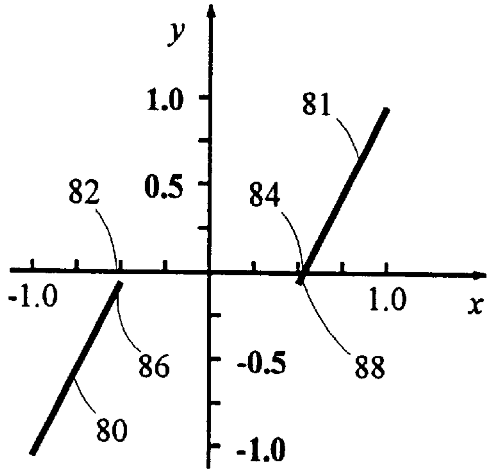

If quantizer 74 is an asymmetric mid-tread signed quantizer, then the mapping function represented by lines 80 and 81 illustrated in FIG. 9B would be suitable for mapping function 72. According to this mapping function, values within the interval from −1.0 to −0.5 are mapped linearly into an interval from $-1.0-\frac{1}{2}\Delta Q$ to $-\frac{1}{2}\Delta Q$, where $\Delta Q$ is the quantization step size of quantizer 74, and values within the interval from +0.5 to +1.0 are mapped linearly into an interval from $-\frac{1}{2}\Delta Q$ to $+1.0-\frac{1}{2}\Delta Q$. In this example, no large-magnitude component can have a value exactly equal to either −0.5 or +0.5 because components with these values are classified as small-magnitude components. Because of this, mapping transform 72 will not map any input value to $-\frac{1}{2}\Delta Q$ exactly; however, it may map input values arbitrarily close to and on either side of $-\frac{1}{2}\Delta Q$.

Figure 9C:
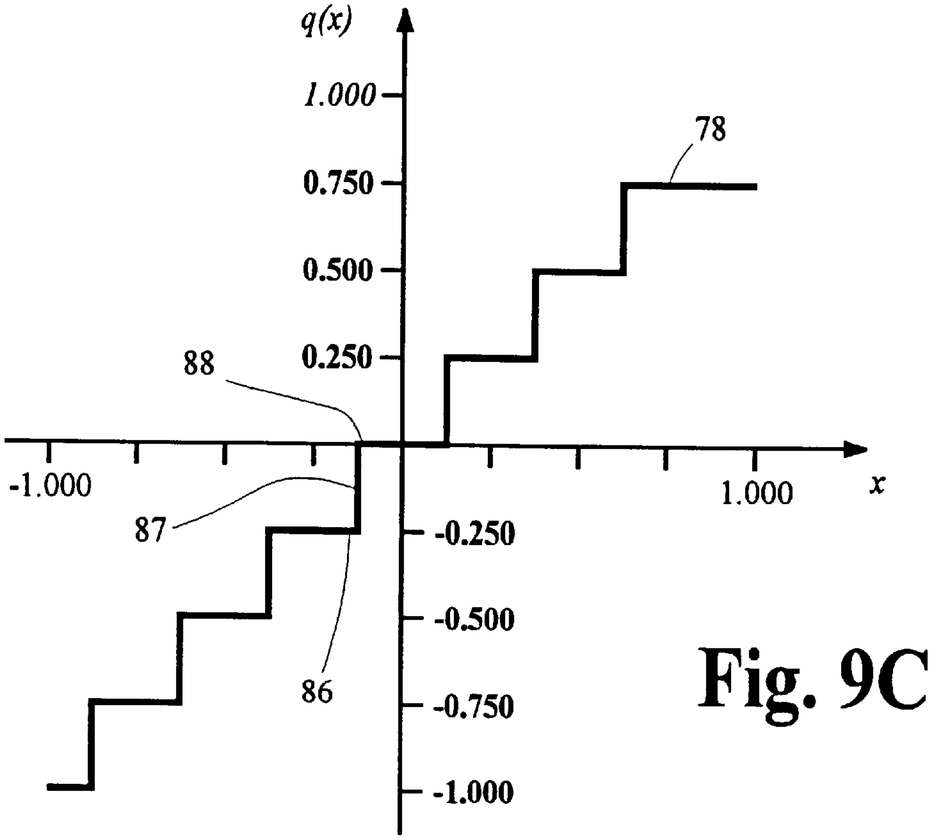

The effect of this mapping may be seen by referring to FIGS. 9B and 9C. Referring to FIG. 9B, it can be seen that mapping transform 72 maps input points 82 and 84 to mapped points 86 and 88, respectively. Referring to FIG. 9C, which illustrates a function representing the end-to-end effects of a 3-bit asymmetric mid-tread signed quantizer and complementary dequantizer, the mapped points 86 and 88 may be seen to lie on either side of quantizer decision point 87, which has the value $-\frac{1}{2}\Delta Q$.

A complementary split-interval dequantizer may be implemented by an asymmetric mid-tread signed dequantizer that is complementary to quantizer 74 followed by a mapping transform that is the inverse of mapping transform 72.

d) Composite Functions

In an example discussed above, gain-adaptive quantization with a gain factor G=2 is used to quantize components of a subband signal for which conventional bit allocation b is equal to three bits. As explained above in conjunction with Table I, 3 bits are used to quantize the large-magnitude components bits and 2=(b-1) bits are used to quantize the small-magnitude gain-modified components. Preferably, a quantizer that implements the quantization function of FIG. 8 is used to quantize the large-magnitude components.

Figure 10:
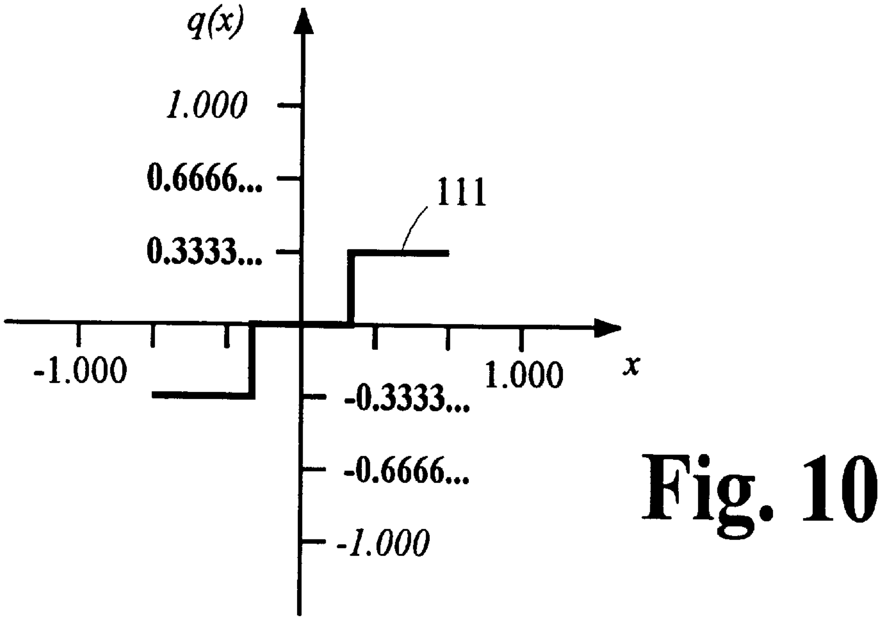
FIGS. 10 through 12 are graphical illustrations of quantization functions.

A 2-bit symmetric mid-tread signed quantizer and complementary dequantizer that implement function 111 shown in FIG. 10 may be used for the small-magnitude gain-modified components. Function 111 as illustrated takes into account the scaling and descaling effects of the gain factor G=2 used in conjunction with the quantizer and dequantizer, respectively. The output values for the dequantizer are −0.3333 . . . , 0.0 and +0.3333 . . . , and the quantizer decision points are at −0.1666 . . . and +0.1666 . . . .

Figure 11:
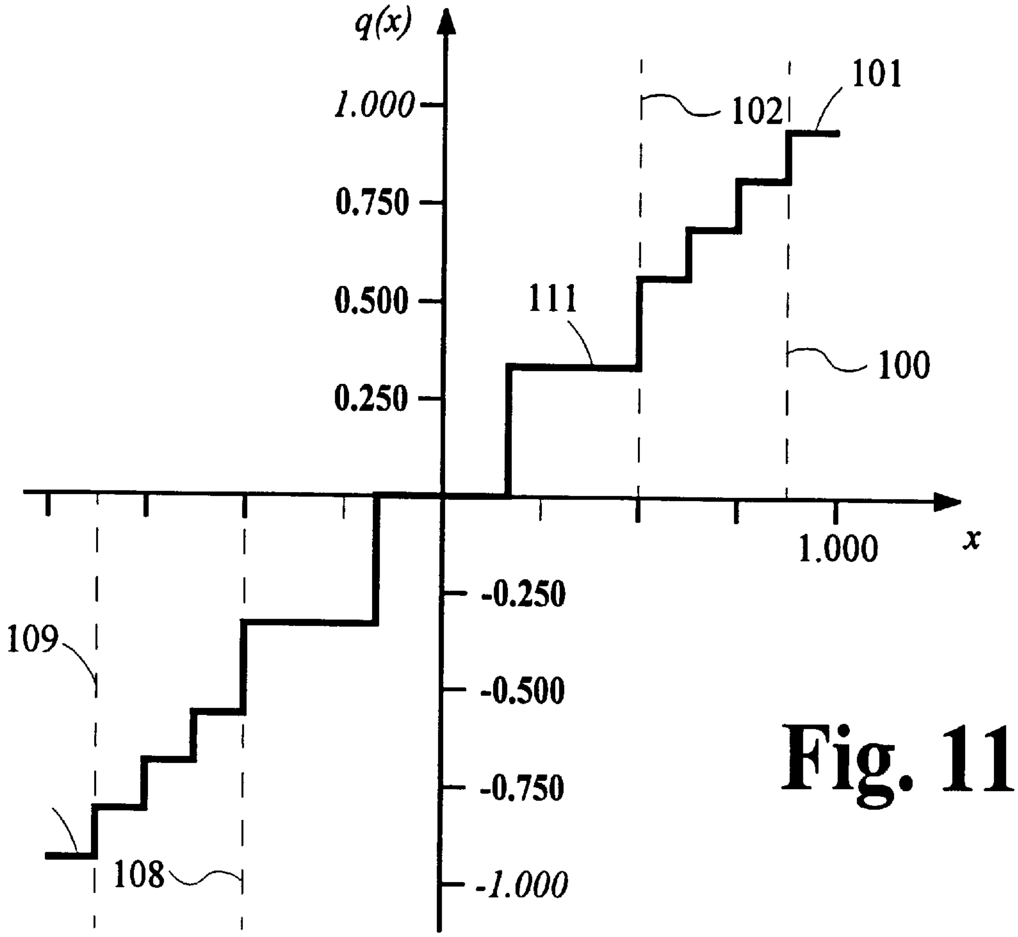

A composite of the functions for the large-magnitude and small-magnitude components is illustrated in FIG. 11.

e) Alternative Split-Interval Functions

Figure 12:
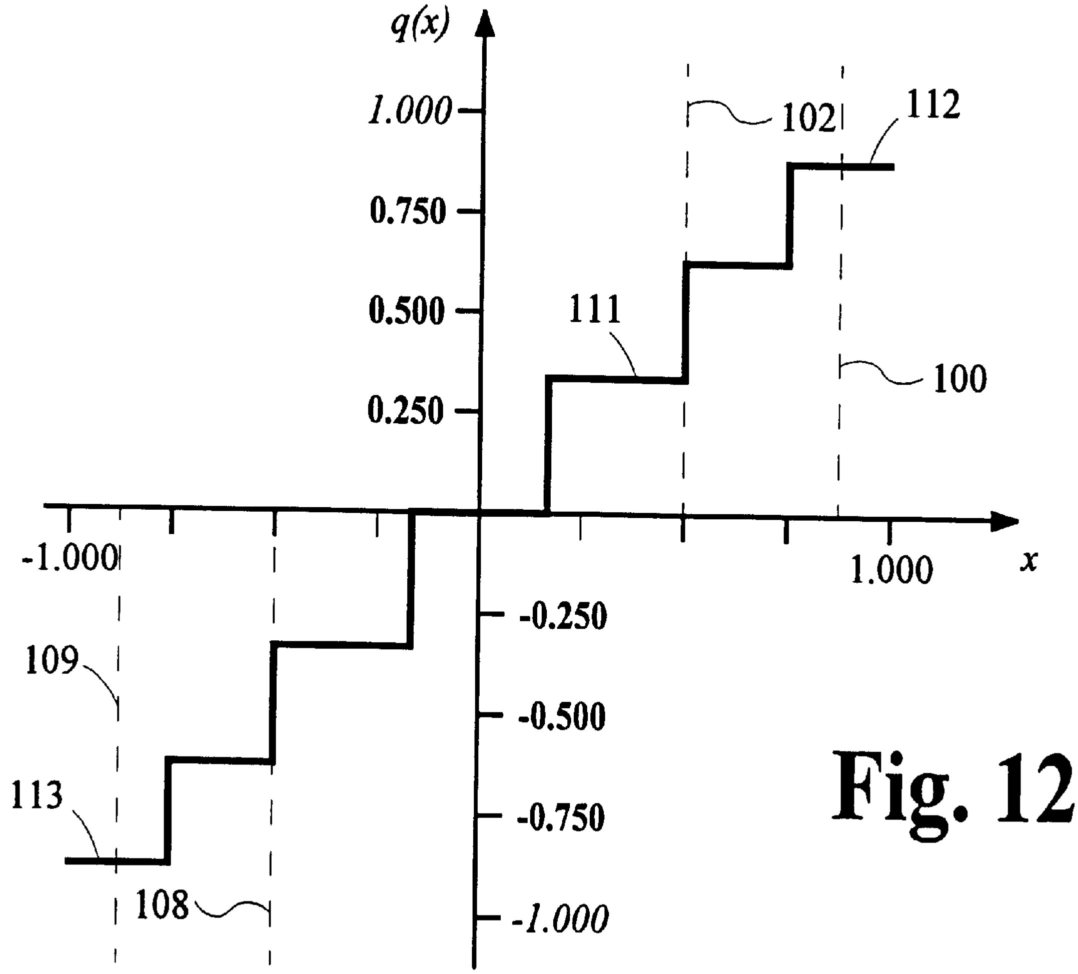

The use of a split-interval quantizer with a gain factor G=2 and a threshold at or about 0.500 provides an improvement in quantization resolution of about one bit. This improved resolution may be used to preserve the quantization resolution of large-magnitude components while reducing the bit allocation to these components by one bit. In the example discussed above, 2-bit quantizers could be used to quantize both large- magnitude and small-magnitude components. A composite of the quantization functions implemented by the two quantizers is shown in FIG. 12. Quantizers implementing quantization functions 112 and 113 could be used to quantize large-magnitude components having positive and negative amplitudes, respectively, and a quantizer implementing quantization function 111 could be used to quantize the small-magnitude components.

The use of split-interval quantization functions with larger gain factors and smaller thresholds does not provide a full bit of improved quantization resolution; therefore, the bit allocation cannot be reduced without sacrificing the quantization resolution. In preferred embodiments, the bit allocation b for large-magnitude mantissas is reduced by one bit for blocks that are gain-adaptively quantized using a gain factor G=2.

The dequantization function provided in the decoder should be complementary to the quantization function used in the encoder.

6. Intra-Frame Coding

The term "encoded signal block" is used here to refer to the encoded information that represents all of the subband-signal blocks for the frequency subbands across the useful bandwidth of the input signal. Some coding systems assemble multiple encoded signal blocks into larger units, which are referred to here as a frame of the encoded signal. A frame structure is useful in many applications to share information across encoded signal blocks, thereby reducing information overhead, or to facilitate synchronizing signals such as audio and video signals. A variety of issues involved with encoding audio information into frames for audio/video applications are discussed in U.S. patent application Ser. No. PCT/US 98/20751 filed Oct. 17, 1998, which is incorporated herein by reference.

The features of gain-adaptive quantization discussed above may be applied to groups of subband-signal blocks that are in different encoded signal blocks. This aspect may be used advantageously in applications that group encoded signal blocks into frames, for example. This technique essentially groups the components in multiple subband-signal blocks within a frame and then classifies the components and applies a gain factor to this group of components as described above. This so called intra-frame coding technique may share control information among the blocks within a frame. No particular grouping of encoded signal blocks is critical to practice this technique.

D. Implementation

Figure 13:
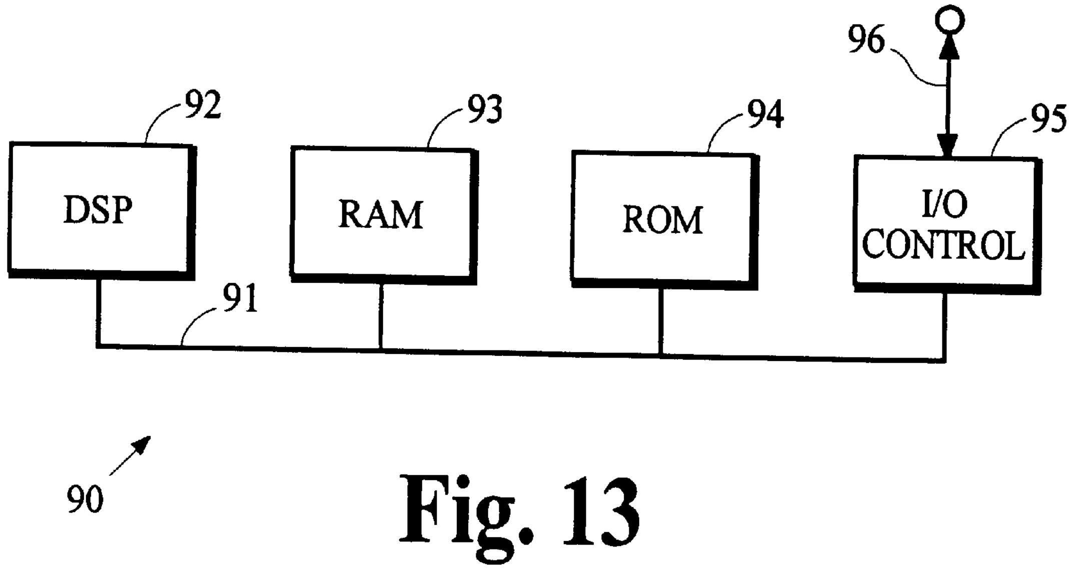
FIG. 13 is a block diagram of an apparatus that may be used to carry out various aspects of the present invention.

The present invention may be implemented in a wide variety of ways including software in a general-purpose computer system or in some other apparatus that includes more specialized components such as digital signal processor (DSP) circuitry coupled to components similar to those found in a general-purpose computer system. FIG. 13 is a block diagram of device 90 that may be used to implement various aspects of the present invention. DSP 92 provides computing resources. RAM 93 is system random access memory (RAM). ROM 94 represents some form of persistent storage such as read only memory (ROM) for storing programs needed to operate device 90 and to carry out various aspects of the present invention. I/O control 95 represents interface circuitry to receive and transmit audio signals by way of communication channel 96. Analog-to-digital converters and digital-to-analog converters may be included in I/O control 95 as desired to receive and/or transmit analog audio signals. In the embodiment shown, all major system components connect to bus 91 which may represent more than one physical bus; however, a bus architecture is not required to implement the present invention.

In embodiments implemented in a general purpose computer system, additional components may be included for interfacing to devices such as a keyboard or mouse and a display, and for controlling a storage device having a storage medium such as magnetic tape or disk or an optical medium. The storage medium may be used to record programs of instructions for operating systems, utilities and applications, and may include embodiments of programs that implement various aspects of the present invention.

The functions required to practice various aspects of the present invention can be performed by components that are implemented in a wide variety of ways including discrete logic components, one or more ASICs and/or program-controlled processors. The manner in which these components are implemented is not important to the present invention.

Software implementations of the present invention may be conveyed by a variety machine readable media such as baseband or modulated communication paths throughout the spectrum including from supersonic to ultraviolet frequencies, or storage media including those that convey information using essentially any magnetic or optical recording technology including magnetic tape, magnetic disk and optical disc. Various aspects can also be implemented in various components of computer system 90 by processing circuitry such as ASICs, general-purpose integrated circuits, microprocessors controlled by programs embodied in various forms of read-only memory (ROM) or RAM and other techniques.

What is claimed is:

1. A method for encoding an input signal that comprises:

receiving the input signal and generating a subband-signal block of subband-signal components representing a frequency subband of the input signal;

comparing magnitudes of the components in the subband-signal block with a threshold, placing each component into one of two or more classes according to component magnitude, and obtaining a gain factor;

applying the gain factor to the components placed into one of the classes to modify the magnitudes of some of the components in the subband-signal block;

quantizing the components in the subband-signal block; and assembling into an encoded signal control information conveying classification of the components and non-uniform length symbols representing the quantized subband-signal components.

2. A method according to claim 1 that assembles control information into the encoded signal that indicates those quantized subband-signal components having magnitudes that are not modified according to the gain factor, wherein the control information is conveyed by one or more reserved symbols that are not used to represent quantized subband-signal components.

3. A method according to claim 1 that comprises obtaining the threshold from a function that is dependent on gain factor but independent of quantization step size of the quantized components.

4. A method according to claim 1 that comprises obtaining the threshold from a function that is dependent on gain factor and quantization step size of the quantized components.

5. A method according to claim 1 that comprises:

adaptively changing a respective quantization step size for each component in the subband-signal block according to the class into which the component is placed by adaptively allocating bits to the component, and obtains the gain factor such that the number of bits allocated to the components with modified magnitudes is reduced while preserving the respective quantization step size.

6. A method according to claim 1 that comprises quantizing the components placed into one of the classes according to a split-interval quantization function.

7. A method according to claim 1 that places each component into one of three or more classes according to component magnitude and comprises:

obtaining one or more additional gain factors each associated with a respective class, and applying each of the additional gain factors to the components placed into the associated respective class.

8. A method according to claim 1 that comprises:

comparing magnitudes of at least some of the components in the subband-signal block with a second threshold, placing each component into one of two or more second classes according to component magnitude, and obtaining a second gain factor; and applying the second gain factor to the components placed into one of the second classes to modify the magnitudes of some of the components in the subband-signal block;

wherein the non-uniform length symbols represent the quantized components as modified by the gain factor and the second gain factor.

9. A method according to claim 1 that quantizes at least some of the components using one or more non-overloading quantizers.

10. A method for decoding an encoded signal comprising:

receiving the encoded signal and obtaining therefrom control information and non-uniform length symbols, and obtaining from the non-uniform length symbols quantized subband-signal components representing a frequency subband of an input signal;

dequantizing the subband-signal components to obtain subband-signal dequantized components;

applying a gain factor to modify magnitudes of some of the dequantized components according to the control information; and generating an output signal in response to the subband-signal dequantized components.

11. A method according to claim 10 that obtains control information from the encoded signal indicating those quantized subband-signal components having magnitudes that are not to be modified according to the gain factor, wherein the control information is conveyed by one or more reserved symbols that are not used to represent quantized subband-signal components.

12. A method according to claim 10 that comprises dequantizing some of the quantized components in the subband-signal block according to a dequantization function that is complementary to a split-interval quantization function.

13. A method according to claim 10 that comprises applying a second gain factor to modify magnitudes of some of the dequantized components according to the control information.

14. A method according to claim 10 that dequantizes at least some of the quantized components using one or more dequantizers that are complementary to a respective non-overloading quantizer.

15. An apparatus for encoding an input signal comprising:

an analysis filter having an input that receives the input signal and having an output through which is provided a subband-signal block of subband-signal components representing a frequency subband of the input signal;

a subband-signal block analyzer coupled to the analysis filter that compares magnitudes of the components in the subband-signal block with a threshold, places each component into one of two or more classes according to component magnitude, and obtains a gain factor, a subband-signal component processor coupled to the subband-signal block analyzer that applies the gain factor to the components placed into one of the classes to modify the magnitudes of some of the components in the subband-signal block;

a first quantizer coupled to the subband-signal processor that quantizes the components in the subband-signal block having magnitudes modified according to the gain factor; and a formatter coupled to the first quantizer that assembles non-uniform length symbols representing the quantized subband-signal components and control information conveying classification of the components into an encoded signal.

16. An apparatus according to claim 15 that comprises a second quantizer coupled to the subband-signal block analyzer that quantizes the components placed into one of the classes according to a split-interval quantization function, wherein the formatter is also coupled to the second quantizer.

17. An apparatus according to claim 15 wherein the formatter assembles control information into the encoded signal that indicates those quantized subband-signal components having magnitudes that are not modified according to the gain factor, wherein the control information is conveyed by one or more reserved symbols that are not used to represent quantized subband-signal components.

18. An apparatus according to claim 15 that obtains the threshold from a function that is dependent on gain factor but independent of quantization step size of the quantized components.

19. An apparatus according to claim 15 that obtains the threshold from a function that is dependent on gain factor and quantization step size of the quantized components.

20. An apparatus according to claim 15 that adaptively changes a respective quantization step size for each component in the subband-signal block according to the class into which the component is placed by adaptively allocating bits to the component, and obtains the gain factor such that the number of bits allocated to the components with modified magnitudes is reduced while preserving the respective quantization step size.

21. An apparatus according to claim 15 that places each component into one of three or more classes according to component magnitude, obtains one or more additional gain factors each associated with a respective class, and applies each of the additional gain factors to the components placed into the associated respective class.

22. An apparatus according to claim 15 wherein the subband-signal block analyzer compares magnitudes of at least some of the components in the subband-signal block with a second threshold, places each component into one of two or more second classes according to component magnitude, and obtains a second gain factor; and the subband-signal component processor applies the second gain factor to the components placed into one of the second classes to modify the magnitudes of some of the components in the subband-signal block;

wherein the non-uniform length symbols represent the quantized components as modified by the gain factor and the second gain factor.

23. An apparatus according to claim 15 that quantizes at least some of the components using one or more non-overloading quantizers.

24. An apparatus for decoding an encoded signal comprising:

a deformatter that receives the encoded signal and obtains therefrom control information and non-uniform length symbols, and obtains from the non- uniform length symbols quantized subband-signal components;

a first dequantizer coupled to the deformatter that dequantizes some of the subband-signal components in the block according to the control information to obtain first dequantized components;

a subband-signal block processor coupled to the first dequantizer that applies a gain factor to modify magnitudes of some of the first dequantized components in the subband-signal block according to the control information; and a synthesis filter having an input coupled to the subband-signal processor and having an output through which an output signal is provided.

25. An apparatus according to claim 24 that comprises a second dequantizer coupled to the deformatter that dequantizes other subband-signal components in the block according to a dequantization function that is complementary to a split-interval quantization function to obtain second dequantized components, and wherein the synthesis filter has an input coupled to the second dequantizer.

26. An apparatus according to claim 24 wherein the deformatter obtains control information from the encoded signal indicating those quantized subband-signal components having magnitudes that are not to be modified according to the gain factor, wherein the control information is conveyed by one or more reserved symbols that are not used to represent quantized subband-signal components.

27. An apparatus according to claim 24 wherein the subband-signal block processor applies a second gain factor to modify magnitudes of some of the dequantized components according to the control information.

28. An apparatus according to claim 24 that dequantizes at least some of the quantized components using one or more dequantizers that are complementary to a respective non-overloading quantizer.

29. A medium conveying encoded information, wherein the encoded information comprises:

(1) non-uniform length symbols representing quantized subband-signal components, wherein the quantized subband-signal components correspond to elements of a subband-signal block representing a frequency subband of an audio signal;

(2) control information indicating a classification of the quantized subband-signal components according to magnitudes of the corresponding subband-signal block elements; and (3) an indication of a gain factor that pertains to magnitudes of some of the quantized subband-signal components according to the control information.

30. A medium according to claim 29 wherein the control information is conveyed by one or more reserved symbols that are not used to represent quantized subband-signal components and indicates those quantized subband-signal components having magnitudes that do not pertain to the gain factor.

31. A medium according to claim 29 that comprises second non-uniform length symbols representing second quantized subband-signal components corresponding to a second subband-signal block representing a second frequency subband of the audio signal, wherein the non-uniform length symbols and the second non-uniform length symbols represent quantized components having identical quantization step sizes but have different symbol lengths.

32. A medium according to claim 29 that comprises control information indicating a classification of subband-signal components into three or more classes according to component magnitude.

33. A medium readable by a device embodying a program of instructions for execution by the device to perform a method for encoding an input signal, the method comprising:

receiving the input signal and generating a subband-signal block of subband-signal components representing a frequency subband of the input signal;

comparing magnitudes of the components in the subband-signal block with a threshold, placing each component into one of two or more classes according to component magnitude, and obtaining a gain factor;

applying the gain factor to the components placed into one of the classes to modify the magnitudes of some of the components in the subband-signal block;

quantizing the components in the subband-signal block; and assembling into an encoded signal control information conveying classification of the components and non-uniform length symbols representing the quantized subband-signal components.

34. A medium according to claim 33 that assembles control information into the encoded signal that indicates those quantized subband-signal components having magnitudes that are not modified according to the gain factor, wherein the control information is conveyed by one or more reserved symbols that are not used to represent quantized subband-signal components.

35. A medium according to claim 33 that comprises obtaining the threshold from a function that is dependent on gain factor but independent of quantization step size of the quantized components.

36. A medium according to claim 33 that comprises obtaining the threshold from a function that is dependent on gain factor and quantization step size of the quantized components.

37. A medium according to claim 33 that comprises:

adaptively changing a respective quantization step size for each component in the subband-signal block according to the class into which the component is placed by adaptively allocating bits to the component, and obtains the gain factor such that the number of bits allocated to the components with modified magnitudes is reduced while preserving the respective quantization step size.

38. A medium according to claim 33 that comprises quantizing the components placed into one of the classes according to a split-interval quantization function.

39. A medium according to claim 33 that places each component into one of three or more classes according to component magnitude and comprises:

obtaining one or more additional gain factors each associated with a respective class, and applying each of the additional gain factors to the components placed into the associated respective class.

40. A medium according to claim 33 that comprises:

comparing magnitudes of at least some of the components in the subband-signal block with a second threshold, placing each component into one of two or more second classes according to component magnitude, and obtaining a second gain factor; and applying the second gain factor to the components placed into one of the second classes to modify the magnitudes of some of the components in the subband-signal block;

wherein the non-uniform length symbols represent the quantized components as modified by the gain factor and the second gain factor.

41. A medium according to claim 33 that quantizes at least some of the components using one or more non-overloading quantizers.

42. A medium readable by a device embodying a program of instructions for execution by the device to perform a method for decoding an encoded signal, the method comprising:

receiving the encoded signal and obtaining therefrom control information and non-uniform length symbols, and obtaining from the non-uniform length symbols quantized subband-signal components representing a frequency subband of an input signal;

dequantizing the subband-signal components to obtain subband-signal dequantized components;

applying a gain factor to modify magnitudes of some of the dequantized components according to the control information; and generating an output signal in response to the subband-signal dequantized components.

43. A medium according to claim 42 that obtains control information from the encoded signal indicating those quantized subband-signal components having magnitudes that are not to be modified according to the gain factor, wherein the control information is conveyed by one or more reserved symbols that are not used to represent quantized subband-signal components.

44. A medium according to claim 42 that comprises dequantizing some of the quantized components in the subband-signal block according to a dequantization function that is complementary to a split-interval quantization function.

45. A medium according to claim 42 that comprises applying a second gain factor to modify magnitudes of some of the dequantized components according to the control information.

46. A medium according to claim 42 that dequantizes at least some of the quantized components using one or more dequantizers that are complementary to a respective non-overloading quantizer.

* * * * *